United States Patent
Song (10) Patent No.: US 7,989,828 B2
(45) Date of Patent: Aug. 2, 2011

(54) HIGHLY EFFICIENT III-NITRIDE-BASED TOP EMISSION TYPE LIGHT EMITTING DEVICE HAVING LARGE AREA AND HIGH CAPACITY

(75) Inventor: June-O Song, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 341 days.

(21) Appl. No.: 11/506,016

(22) Filed: Aug. 17, 2006

(65) Prior Publication Data

US 2007/0040162 A1     Feb. 22, 2007

(30) Foreign Application Priority Data

Aug. 19, 2005     (KR) .................. 10-2005-0075983

(51) Int. Cl.
*H01L 33/00*     (2010.01)
(52) U.S. Cl. .................. 257/98; 257/E33.065; 257/81; 257/99
(58) Field of Classification Search .............. 257/79, 257/81, 98, 99, E33.065
See application file for complete search history.

(56) References Cited

U.S. PATENT DOCUMENTS

| | | |
|---|---|---|
| 6,287,947 B1 | 9/2001 | Ludowise et al. |
| 6,495,862 B1 * | 12/2002 | Okazaki et al. ............. 257/103 |
| 6,614,060 B1 * | 9/2003 | Wang et al. ................ 257/103 |
| 6,847,057 B1 * | 1/2005 | Gardner et al. ............. 257/99 |
| 7,244,957 B2 * | 7/2007 | Nakajo et al. .............. 257/13 |
| 7,250,635 B2 * | 7/2007 | Lee et al. .................. 257/98 |
| 2004/0141333 A1 * | 7/2004 | Rattier et al. .............. 362/553 |
| 2004/0188689 A1 * | 9/2004 | Shono et al. ............... 257/79 |
| 2005/0285136 A1 * | 12/2005 | Ou et al. .................. 257/103 |
| 2006/0054907 A1 * | 3/2006 | Lai ......................... 257/96 |
| 2006/0273333 A1 * | 12/2006 | Wu et al. .................. 257/94 |

FOREIGN PATENT DOCUMENTS

| | | |
|---|---|---|
| CN | 101027790 | 8/2007 |
| JP | 10173231 | 6/1998 |
| JP | 2003152221 | 5/2003 |
| KR | 1020050031720 | 4/2005 |
| KR | 1020050064556 | 6/2005 |

OTHER PUBLICATIONS

Nitride-Based Light-Emitting Diodes With Ni/ITO p-Type Ohmic Contacts; Author: Y.C. Lin, et al.; IEEE Photonics Technology Letters; vol. 14, No. 12 pp. 1668-1670; Dec. 2002.

Enhanced Output Power of InGaN—GaN Light-Emitting Diodes With High-Transparency Nickel-Oxide-Indium-Tin-Oxide Ohmic Contacts; Author: Shyi-Ming Pan, et al.; IEEE Photonics Technology Letters; vol. 15, No. 5, pp. 646-648; May 2003.

* cited by examiner

*Primary Examiner* — Shouxiang Hu
(74) *Attorney, Agent, or Firm* — Cantor Colburn LLP (57) ABSTRACT

A nitride-based top emission type light emitting device and a method of manufacturing the same, the light emitting device including an n-nitride-based cladding layer, a p-nitride-based cladding layer, a nitride-based active layer, and a multiple p-ohmic contact layer. The multiple p-ohmic contact layer includes at least one pair of an ohmic modification layer and a transparent conducting layer. The ohmic modification layer includes a poly-crystal nitride layer or an amorphous nitride layer including nitrogen (N) combined with at least one of aluminum (Al), indium (In) or gallium (Ga). The ohmic modification layer is prepared in the form of a droplet or a thin film. Pores or dots are formed on the poly-crystal nitride layer or the amorphous nitride layer so as to provide the multiple p-ohmic contact layer with a photonic crystal effect.

8 Claims, 5 Drawing Sheets

Fig. 1

(PRIOR ART)

Fig. 2

(PRIOR ART)

Fig. 3

(PRIOR ART)

HIGHLY EFFICIENT III-NITRIDE-BASED TOP EMISSION TYPE LIGHT EMITTING DEVICE HAVING LARGE AREA AND HIGH CAPACITY

This application claims priority to Korean Patent Application No. 2005-75983, filed on Aug. 19, 2005, and all the benefits accruing therefrom under 35 U.S.C. §119, the contents of which in its entirety are herein incorporated by reference.

BACKGROUND OF THE INVENTION

1. Field of the Invention

The present invention relates to a nitride-based top emission type light emitting device and a method of manufacturing the same. More particularly, the present invention relates to a nitride-based top emission type light emitting device having a large area and high capacity and a method of manufacturing the same, in which an ohmic modification layer is interposed between a p-nitride cladding layer and a transparent conducting layer, thereby improving electro-optical characteristics of the nitride-based top emission type light emitting device, such as the external quantum efficiency ("EQE").

2. Description of the Related Art

III-nitride-based semiconductors are direct-type semiconductor materials having widest band gaps used in optical semiconductor fields. Such III-nitride-based semiconductors are used to fabricate high efficient light emitting devices capable of emitting light having wide wavelength bands in a range between a yellow band and an ultraviolet band. However, although various endeavors have performed for several years in various industrial fields to provide the light emitting device having a relatively large area, high capacity, and high brightness, such endeavors have ended in a failure due to the following basic difficulties related to materials and technologies.

First, a difficulty of providing a substrate adapted to grow a nitride-based semiconductor having a high quality.

Second, a difficulty of growing an InGaN layer and an AlGaN layer including a great amount of indium (In) or aluminum (Al).

Third, a difficulty of growing a p-nitride-based semiconductor having a relatively higher hole carrier density.

Fourth, a difficulty of forming a high-quality ohmic contact electrode (e.g., ohmic contact layer) suitable for an n-nitride-based semiconductor and a p-nitride-based semiconductor.

Nevertheless of the above difficulties derived from materials and technologies, in late 1993. Nichia chemicals (a Japanese Company) developed a blue light emitting device by using a nitride-based semiconductor. A white light emitting device included a high brightness blue/green light emitting device coupled with a phosphor. Such a white light emitting device is practically used in various illumination industrial fields.

In view of performance of a light emitting device, such as a light emitting diode ("LED") or a laser diode ("LD") employing a high-quality nitride-based semiconductor, characteristics of an ohmic contact formed between a semiconductor and an electrode are very important factors.

Nitride-based LEDs are classified into top-emission type LEDs and flip-chip type LEDs based on the emission direction of light generated from a nitride-based active layer. In the case of the top-emission type LED, the light generated from the nitride-based active layer is emitted to an exterior through a p-ohmic contact layer that makes contact with a p-nitride-based cladding layer. Therefore, a high-quality p-ohmic contact layer is necessary in order to obtain a nitride-based top-emission type LED having a high quality. Such a nitride-based top-emission type LED must have a higher light transmittance of 90% or more, and a non-contact ohmic resistance value as low as possible. That is, in order to fabricate a next-generation nitride-based top emission type LED having the high capacity, large area, and high brightness, superior ohmic contact characteristics are essentially necessary to simultaneously perform the current spreading in the lateral direction and the current injecting in the vertical direction such that a high surface-resistance value of a p-nitride-based cladding layer caused by a low hole density can be compensated. In addition, a transparent p-ohmic contact electrode having a higher light transmittance must be provided in order to minimize light absorption when the light generated from the nitride-based active layer is output to the exterior through the p-type ohmic contact layer.

Figure 1:
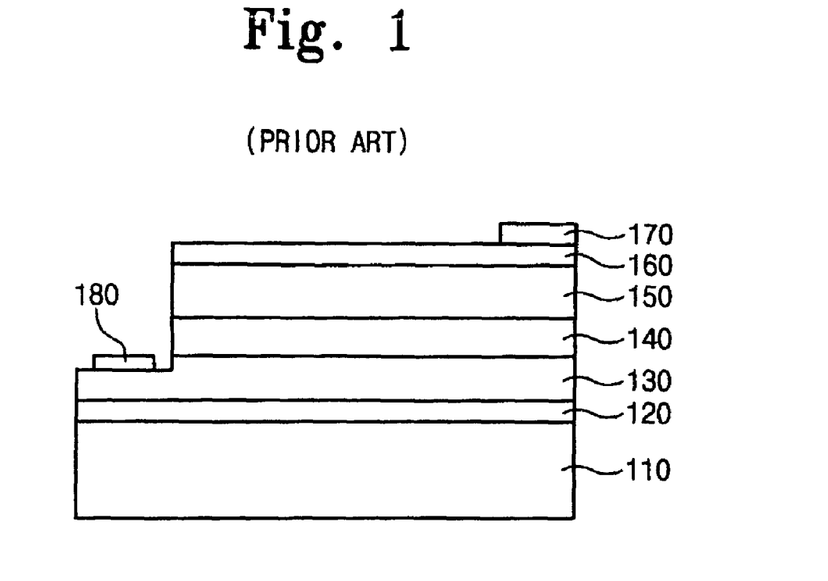
FIG. 1 is a cross-sectional view showing a conventional nitride-based top emission type light emitting device provided with a p-ohmic contact layer including a nickel-gold (Ni—Au) layer or a thick transparent conducting layer, which is solely provided or selectively combined with a metal layer.

FIG. 1 is a cross-sectional view showing a conventional nitride-based top emission type light emitting device, such as is available from Nichia Chemicals of Japan.

Referring to FIG. 1, the conventional nitride-based top emission type light emitting device includes a substrate 110. A nitride-based buffer layer 120, an n-nitride-based cladding layer 130, a multiple quantum well nitride-based active layer 140, a p-nitride-based cladding layer 150, and a p-ohmic contact layer 160 are sequentially formed on the substrate 110. Reference numerals 170 and 180 represent a p-type electrode pad and an n-type electrode pad, respectively.

The p-ohmic contact layer 160 is provided with a p-ohmic contact electrode including a thin semi-transparent nickel-gold (Ni—Au) electrode having superior ohmic contact characteristics or a transparent conducting oxide layer, such as an indium tin oxide (ITO) layer. However, although the p-ohmic contact electrode employing semi-transparent nickel-gold (Ni—Au) has superior electrical ohmic contact characteristics, it represents a low light transmittance, so that a large amount of light is absorbed in the p-ohmic contact electrode when the light generated from the multiple quantum well nitride-based active layer 140 is emitted to the exterior. Thus, the light emitting device represents a low EQE.

The ITO electrode represents superior light transmittance, so that the EQE of the light emitting device can be improved. However, the ITO electrode forms a schottky-type contact causing a relatively large voltage drop, rather than the ohmic contact, on the p-nitride-based cladding layer 150, so that the current injection can not be readily achieved. Thus, if the ITO electrode is used as the p-ohmic contact electrode, the nitride-based light emitting device having high capacity, large area and high brightness cannot be obtained.

As shown in FIG. 1, the top-emission type LED employing the nitride-based semiconductor includes a p-ohmic contact layer that can be obtained by stacking thin nickel (Ni) or a thick transparent conducting layer, such as, gold (Au) or indium tin oxide (ITO), on a p-nitride cladding layer and then annealing the p-nitride cladding layer in a oxygen ($O_2$) atmosphere or in a nitrogen ($N_2$) atmosphere. In particular, when the ohmic contact layer including semi-transparent nickel-gold (Ni—Au) and having a low non-contact resistance value of about $10^{-3}$ $cm^2$ to $10^{-4}$ $cm^2$ is subject to the annealing process at the temperature of about 500° C., nickel oxide (NiO), which is p-semiconductor oxide, is distributed in the form of an island on the interfacial surface between the p-nitride-based cladding layer and the nickel-gold ohmic contact layer. In addition, gold (Au) particles having superior conductivity are embedded into the island-shaped nickel oxide (NiO), thereby forming a micro structure. Such a micro structure may reduce the height and width of the Schottky barrier formed between the p-nitride cladding layer and the nickel-gold ohmic contact layer, provide hole carriers in the n-nitride cladding layer, and distribute gold (Au) having superior conductivity, thereby achieving superior current spreading performance. However, since the nitride-based top emission type LED employing the p-ohmic contact layer consisting of nickel-gold (Ni—Au) includes gold (Au) that reduces the light transmittance, the nitride-based top emission type LED represents a low EQE (external quantum efficiency), so the nitride-based top emission type LED is not suitable for the next-generation LED requiring a high capacity, large area and high brightness.

There exists another method of providing a p-ohmic contact layer without using the semi-transparent Ni—Au. According to this method, the p-ohmic contact layer is obtained by directly depositing a transparent conducting oxide layer including a thick transparent conducting material, such as indium (In), tin (Sn) or zinc (Zn) which is known in the art as a material for a high transparent ohmic contact electrode, and a transparent conducting nitride layer including transition metal, such as titanium (Ti) or tantalum (Ta), on a p-nitride-based cladding layer. However, although the ohmic electrode fabricated through the above method can improve the light transmittance, the interfacial characteristic between the ohmic electrode and the p-nitride-based cladding layer is deteriorated, so the ohmic electrode is not suitable for the top emission type nitride-based LED.

Various documents (for example, IEEE PTL, Y. C. Lin, etc. Vol. 14, 1668 and IEEE PTL, Shyi-Ming Pan, etc. Vol. 15, 646) describe a nitride-based top emission type LED having superior electrical and thermal stability and representing the great EQE by employing a p-ohmic contact layer, which is obtained by combining a transparent conducting oxide layer having superior electrical conductivity with a metal, such as nickel (Ni) or ruthenium (Ru), without using a noble metal, such as gold (Au) or a platinum (Pt) in such a manner that the p-ohmic contact layer has light transmittance higher than that of the conventional p-ohmic contact layer of a nickel-gold (Ni—Au) electrode.

Also described is a nitride-based top emission type LED which employs an indium tin oxide (ITO) transparent layer as a p-ohmic contact layer and represents an output power higher than that of a conventional LED employing the conventional nickel-gold (Ni—Au) ohmic electrode. However, although the p-ohmic contact layer employing the ITO transparent layer can maximize the EQE of the LED, a relatively large amount of heat is generated when the nitride-based LED is operated because the p-ohmic contact layer has a relatively high non-contact ohmic resistance value, such the above p-ohmic contact layer is not suitable for the nitride-based LED having the large area, high capacity, and high brightness.

In order to improve the electrical characteristics of the LED, which may be degraded due to the ITO electrode, LumiLeds Lighting Company (U.S.) has developed an LED having higher light transmittance and superior electrical characteristics by combining indium tin oxide (ITO) with thin nickel-gold (Ni—Au) or thin nickel-silver (Ni—Ag) (U.S. Pat. No. 6,287,947 issued to Michael J. Ludowise etc.). However, the LED described in the above patent requires a complicated process to form a p-ohmic contact layer and employs gold (Au) or silver (Ag), so this LED is not suitable for the nitride-based LED having the high capacity, large area and high brightness.

A new nitride-based top emission type LED provided with a high-quality p-ohmic contact layer has been developed. According to the above nitride-based top emission type LED, new transparent nano particles having sizes of 100 nanometers (nm) or less are provided onto an interfacial surface between a p-nitride-based cladding layer and a transparent conducing oxide electrode, such as an ITO electrode, so as to improve the electrical characteristics.

Figure 2:
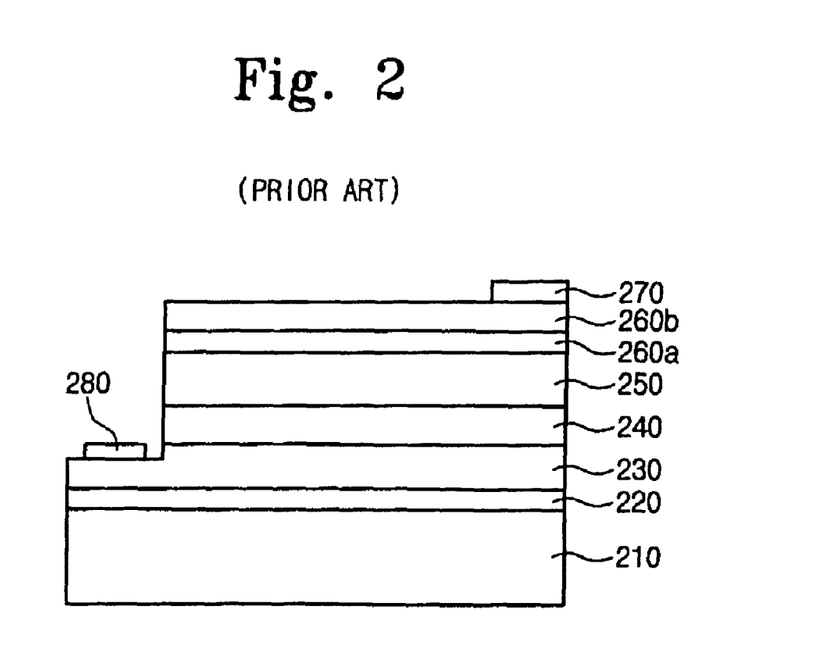
FIG. 2 is a cross-sectional view showing another conventional nitride-based top emission type light emitting device including a p-ohmic contact layer obtained by combining a super lattice structure with a transparent conducting layer.

Technologies related to the fabrication of the nitride-based LED have also been developed. For instance, in order to directly use a highly transparent conducting layer (ITO layer or TiN layer) as a p-ohmic contact layer, as shown in FIG. 2, the transparent conducting layer (ITO layer or TiN layer) is deposited onto a super lattice structure including +-InGaN/n-GaN, n+-GaN/n-InGaN, or n+-InGaN/n-InGaN after repeatedly growing the super lattice structure on an upper surface of a p-nitride-based cladding layer. Then, a high-quality n-ohmic contact is formed through an annealing process and a tunneling junction process is performed, thereby obtaining the nitride-based LED having the high quality.

FIG. 2 is a cross-sectional view showing another conventional nitride-based top emission type light emitting device available from various companies and research institutes of Taiwan, Japan and U.S.

A nitride-based buffer layer 220, an n-nitride-based cladding layer 230, a multiple quantum well nitride-based active layer 240, a p-nitride-based cladding layer 250, and a p-ohmic contact layer 160 are sequentially formed on a substrate 210. Reference numerals 270 and 280 represent a p-type electrode pad and an n-type electrode pad, respectively.

The conventional nitride-based top emission type light emitting device of FIG. 2 includes the p-ohmic contact layer 260 consisting of a transparent conducting oxide layer, such as an indium tin oxide (ITO) layer 260b, and a super lattice layer 260a, such as an In—Ga—N layer.

A thin single crystal dual layer consisting of In(Al)GaN and Al(In)GaN is repeatedly deposited on the p-nitride-based cladding layer 250 before the ITO layer 260b, which serves as a current spread layer, thereby forming the super lattice layer 260a.

Figure 3:
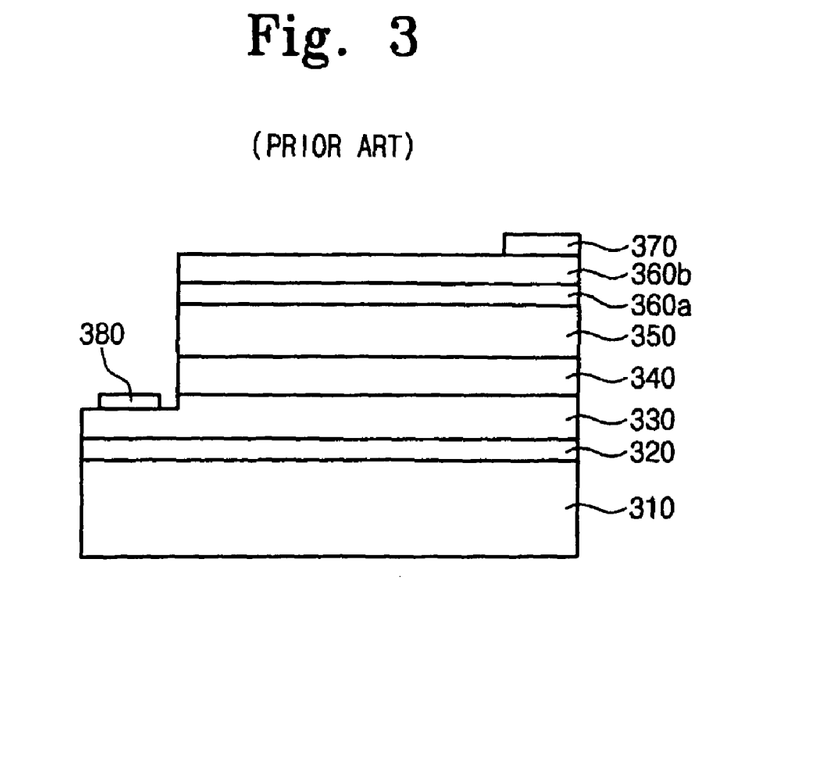
FIG. 3 is a cross-sectional view showing another conventional nitride-based top emission type light emitting device provided with a p-ohmic contact layer including a transparent conducting layer.

According to another technology, as shown in FIG. 3, a semiconductor layer with a narrow band gap, such as p+-AlInGaN, GaN, (Al)GaAs, GaP, or AlGaP having a high hole density of $10^{18}/cm^3$ or more, is grown from an upper surface of a p-nitride-based cladding layer and a transparent conducting layer is deposited onto the semiconductor layer. In this state, an annealing process is performed such that a p-ohmic contact layer can be formed through the tunneling effect.

FIG. 3 is a cross-sectional view showing another conventional nitride-based top emission type light emitting device, such as is available from Epistar Company of Taiwan.

A nitride-based buffer layer 320, an n-nitride-based cladding layer 330, a multiple quantum well nitride-based active layer 340, a p-nitride-based cladding layer 350, and a p-ohmic contact layer 360 are sequentially formed on a substrate 310. Reference numerals 370 and 380 represent a p-type electrode pad and an n-type electrode pad, respectively.

Referring to FIG. 3, a second p+ cladding layer 360a having a higher hole density is deposited on the p-nitride-based cladding layer 350 before a transparent conducting oxide layer 360b is deposited on the p-nitride-based cladding layer 350. Instead of an ohmic contact electrode including semi-transparent nickel-gold (Ni—Au), a transparent conducting oxide layer 360b, such as an ITO layer served as a current spread layer, is used as a p-ohmic contact layer 360. The second p+ cladding layer 360a having the higher density of $5 \times 10^{18}/cm^3$ includes a single crystal epitaxial layer consisting of Al—In—Ga—N, Al—In—Ga—As, or Al—In—Ga—P.

However, the above technologies are not suitable for the nitride-based LED requiring the high capacity, large area and high brightness due to the following basic difficulties related to materials and technologies.

First, since the LED having the high capacity, large area and high brightness is fabricated through the tunneling junction process by using the super lattice structure including an epitaxial nitride-based semiconductor, the LED generates a great amount of heat during the operation thereof, thereby causing serious voltage drop and shortening the life span of the LED.

Second, since a single crystal p+ cladding layer having a crystal size smaller than that of the p-nitride-based cladding layer is provided onto the p-nitride-based cladding layer so as to form the p-ohmic contact layer, light having a short wavelength generated from the nitride-based active layer is absorbed through the p-ohmic contact electrode, so that the EQE is lowered.

In other words, since the above technologies form the p-ohmic contact layer by inducing the tunneling effect after interposing the single crystal super lattice structure having a thin thickness or a second p+ cladding layer having a narrow band gas between the p-nitride-based cladding layer and the transparent p-ohmic contact layer, the nitride-based top emission type LED fabricated through the above conventional technologies represents the low EQE while being operated at a higher operational voltage. Thus, the above conventional technologies are not suitable for the next-generation nitride-based top emission type LED having the high capacity, large area, and high brightness.

BRIEF SUMMARY OF THE INVENTION

An exemplary embodiment provides a high-quality nitride-based top emission type light emitting device having high capacity, large area, and high brightness.

An exemplary embodiment provides a method of manufacturing the nitride-based top emission type light emitting device by forming a p-type multiple ohmic contact layer having a high light transmittance, a low surface resistance and a low non-contact resistance value.

In an exemplary embodiment, a nitride-based top emission type light emitting device includes an n-nitride-based cladding layer, a p-nitride-based cladding layer, a multiple quantum well nitride-based active layer interposed between the n-nitride-based cladding layer and the p-nitride-based cladding layer and a multiple p-ohmic contact layer disposed on the p-nitride-based cladding layer. The multiple p-ohmic contact layer includes at least one pair of an ohmic modification layer and a transparent conducting layer. The ohmic modification layer is not prepared in the form a nitride-based epitaxial layer, but is prepared in the form of a poly-crystal nitride layer or an amorphous nitride layer having nitrogen (N) combined with at least one of aluminum (Al), indium (In) or gallium (Ga). In addition, the ohmic modification layer can be prepared in the form of a droplet, a nano-dot or a thin film including at least one of aluminum (Al), indium (In) or gallium (Ga) without using nitrogen (N).

In an exemplary embodiment, in the process of forming the multiple p-ohmic contact layer, pores or dots having a micro-size are formed on an amorphous nitride-based layer or a poly-crystal nitride-based layer, other than a nitride-based epitaxial layer, before the transparent conducting layer is deposited, thereby allowing the multiple p-ohmic contact layer to have the photonic crystal effect. In an exemplary embodiment, the ohmic modification layer is a III-nitride-based poly-crystal layer or a III-nitride-based amorphous layer, which is formed at the temperature of 700° C. or below. In addition, the ohmic modification layer can be prepared in the form of a droplet, a nano-dot or a thin film including at least one of aluminum (Al), indium (In) or gallium (Ga) without using nitrogen (N). In this case, when performing the annealing process at the temperature of 500° C. or above in order to form the multiple p-ohmic contact layer, a chemical reaction is promoted at the interfacial surface between the ohmic modification layer and the transparent conducting layer formed on the ohmic modification layer so that the ohmic contact characteristics are improved, thereby forming a new transparent conducting layer suitable for a high-quality p-ohmic contact layer.

In an exemplary embodiment, the transparent conducting layer used as a current spread layer includes transparent conducting oxide or transitional metal nitride. The transparent conducting oxide is obtained by combining oxygen (O) with at least one of indium (In), tin (Sn), zinc (Zn), gallium (Ga), cadmium (Cd), magnesium (Mg), beryllium (Be), silver (Ag), molybdenum (Mo), vanadium (V), copper (Cu), iridium (Ir), rhodium (Rh), ruthenium (Ru), tungsten (W), titanium (Ti), tantalum (Ta), cobalt (Co), nickel (Ni), manganese (Mn), platinum (Pt), palladium (Pd), aluminum (Al), or lanthanum (La).

The transitional metal nitride of the transparent conducting layer is a transparent conducting compound obtained by combining nitrogen (N) with titanium (Ti), tungsten (W), tantalum (Ta), vanadium (V), chrome (Cr), zirconium (Zr), niobium (Nb), hafnium (Hf), rhenium (Re) or molybdenum (Mo).

In an exemplary embodiment, the ohmic modification layer has a thickness in a range between 0.1 nanometer and 100 nanometer.

In an exemplary embodiment, the transparent conducting layer used as a current spread layer has a thickness in a range between 1 nanometer and 1000 nanometer.

In an exemplary embodiment, an electrode structure having the photonic crystal effect is used in order to maximize the amount of light emitted from the p-ohmic contact layer in the process of forming the multiple p-ohmic contact layer. The electrode structure having the photonic crystal effect can be obtained by aligning the ohmic modification layer including poly-crystal nitride or amorphous nitride in the form of pores, dots or rods having a size of 10 μm or less through an electrochemical, physical or chemical method, and then depositing the transparent conducting layer used as the current spread layer on the ohmic modification layer.

In an exemplary embodiment, a method of manufacturing a nitride-based top emission type light emitting device includes forming a light emitting structure including an n-nitride-based cladding layer, a multiple quantum well nitride-based active layer and the p-nitride-based cladding layer sequentially disposed on a substrate, forming a multiple p-ohmic contact layer by repeatedly stacking at least one pair of an ohmic modification layer and a transparent conducting layer on the p-nitride-based cladding layer and annealing the multiple p-ohmic contact layer.

In an exemplary embodiment, the ohmic modification layer includes a III-nitride-based poly-crystal layer or a III-nitride-based amorphous layer, which is formed at the temperature of 700° C. or below. In addition, the ohmic modification layer can be prepared in the form of a droplet, a nano-dot or a thin film including at least one of aluminum (Al), indium (In) or gallium (Ga) without using nitrogen (N).

In an exemplary embodiment, magnesium (Mg), zinc (Zn), beryllium (Be), strontium (St) or silicon (Si) is added to the ohmic modification layer in order to improve the electrical and chemical properties of the ohmic modification layer.

In an exemplary embodiment, dopant is added to the transparent conducting layer, serving as the current spread layer, in order to adjust the electrical characteristics of the transparent conducting layer.

In an exemplary embodiment, at least one of elements classified as metal in the periodic table of elements is used as the dopant.

In an exemplary embodiment, the ohmic modification layer or the transparent conducting layer can be deposited through CVD (chemical vapor deposition) or PVD (physical vapor deposition), such as metal-organic chemical vapor deposition ("MOCVD"), plasma enhanced vapor deposition ("MOCVD"), thermal or E-beam evaporation, sputtering, pulsed laser deposition, or plasma laser deposition ("PLD").

In an exemplary embodiment, the annealing process is performed for 3 seconds to 3 hours within the temperature range between the room temperature and 800° C.

In an exemplary embodiment, the annealing process is performed in a reactor equipped with the electrode structure under nitrogen ($N_2$), argon (Ar), helium (He), oxygen ($O_2$), hydrogen ($H_2$), air, or vacuum atmosphere.

BRIEF DESCRIPTION OF THE DRAWINGS

The above and other advantages of the present invention will become readily apparent by reference to the following detailed description when considered in conjunction with the accompanying drawings wherein.

DETAILED DESCRIPTION OF THE INVENTION

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on" another element or layer, the element or layer can be directly on another element or layer or intervening elements or layers. In contrast, when an element is referred to as being "directly on" another element or layer, there are no intervening elements or layers present. Like numbers refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "lower," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "lower" relative to other elements or features would then be oriented "upper" relative to the other elements or features. Thus, the exemplary term "lower" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may occur in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, a nitride-based top emission type light emitting device and a method of manufacturing the same will be described with reference to accompanying drawings.

Figure 4:
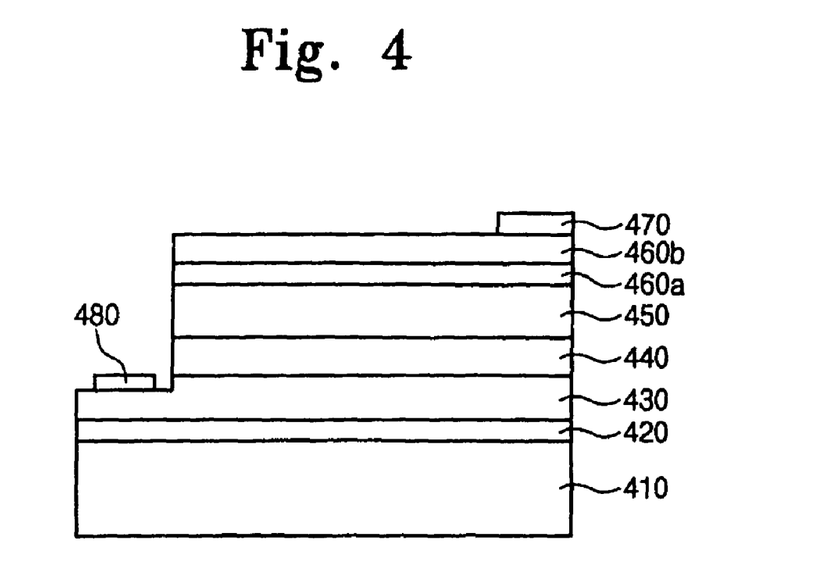
FIG. 4 is a cross-sectional view showing an exemplary embodiment of a top emission type light emitting device including a multiple p-ohmic contact layer according to the present invention.

FIG. 4 is a cross-sectional view showing an exemplary embodiment of a top emission type light emitting device including a multiple p-ohmic contact layer according to the present invention. The multiple p-ohmic contact layer includes an ohmic modification layer 460a and a transparent conducting layer 460b. In an embodiment, the ohmic modification layer 460a does not contain an n-type dopant (e.g., silicon (Si), germanium (Ge), or a Group-IV element), or p-type dopant (e.g., manganese (Mg), zinc (Zn), beryllium (Be), etc.), which imparts n-nitride-based semiconductor property or p-nitride-based semiconductor property. Thus the ohmic modification layer 460a can include a poly-crystal nitride or amorphous nitride that can be obtained by combining nitrogen (N) with at least one of aluminum (Al), indium (In) or gallium (Ga).

In an another embodiment, the ohmic modification layer 460a may include poly-crystal nitride or amorphous nitride obtained by combining nitrogen (N) with at least one of aluminum (Al), indium (In) or gallium (Ga) to which an n-type dopant (e.g., silicon (Si), germanium (Ge) or a Group-IV element) is added. Instead of the nitride-based epitaxial layer having the higher hole density and including a p-type dopant (e.g., manganese (Mg), zinc (Zn), beryllium (Be), etc.), a poly-crystal p-nitride layer or an amorphous p-nitride layer having a hole density lower than that of the p-nitride-based cladding layer 450 can be used as the ohmic modification layer 460a. In yet another embodiment, the ohmic modification layer 460a can be prepared in the form of a droplet and/or a thin film including at least one of aluminum (Al), indium (In) or gallium (Ga) without using nitrogen (N).

The transparent conducting layer 460b, hereinafter also referred to as the "current spread layer," includes transparent conducting oxide or transitional metal nitride. In an exemplary embodiment, the transparent conducting oxide can be obtained by combining oxygen (O) with at least one of indium (In), tin (Sn), zinc (Zn), gallium (Ga), cadmium (Cd), magnesium (Mg), beryllium (Be), silver (Ag), molybdenum (Mo), vanadium (V), copper (Cu), iridium (Ir), rhodium (Rh), ruthenium (Ru), tungsten (W), titanium (Ti), tantalum (Ta), cobalt (Co), nickel (Ni), manganese (Mn), platinum (Pt), palladium (Pd), aluminum (Al), or lanthanum (La).

The transitional metal nitride can be a transparent conducting compound obtained by combining nitrogen (N) with titanium (Ti), tungsten (W), tantalum (Ta), vanadium (V), chrome (Cr), zirconium (Zr), niobium (Nb), hafnium (Hf), rhenium (Re) or molybdenum (Mo).

In one exemplary embodiment, the ohmic modification layer 460a can have a thickness in a range between 0.1 nanometer (nm) and 100 nanometers (nm).

In one exemplary embodiment, the transparent conducting layer 460b, used as the current spread layer, can have a thickness in a range between 1 nanometer and 1000 nanometers.

An electrode structure having the photonic crystal effect is used in order to maximize the amount of light emitted from the p-ohmic contact layer in the process of forming the multiple p-ohmic contact layer. In an exemplary embodiment, the electrode structure including the photonic crystal effect can be obtained by aligning the ohmic modification layer 460a including poly-crystal nitride or amorphous nitride in the form of pores, dots or rods having a size of 10 micrometers ($\mu$m) or less through an electrochemical, physical or chemical method, and then depositing the transparent conducting layer 460b, used as the current spread layer, on the ohmic modification layer 460a.

Technologies developed to provide the photonic crystal effect may exert a negative influence upon the p-nitride-based cladding layer or the ohmic contact layer in the process of forming the pores or dots, thereby degrading the electrical and optical characteristics of the nitride-based light emitting device.

In exemplary embodiment, the electrochemical, physical or chemical method providing the ohmic modification layer 460a with the photonic crystal effect may include, but is not limited to, an E-beam lithography process used to form photonic crystal, a process using anodic aluminum oxide, a grating process using laser, a stamping process using a mold obtained through various methods, a process using a shadow mask obtained through various stencil technologies, or a surface relief grating method using a specific organic substance and laser.

Referring to FIG. 4, the nitride-based top emission type light emitting device includes a substrate 410. A nitride-based buffer layer 420, an n-nitride-based cladding layer 430, a multiple quantum well nitride-based active layer 440, the p-nitride-based cladding layer 450, and the p-ohmic contact layer 460 are sequentially formed on the substrate 410. Reference numerals 470 and 480 represent a p-type electrode pad and an n-type electrode pad, respectively.

The n-type electrode pad 480 is disposed on an extending portion of the n-nitride-based cladding layer 430. The multiple quantum well nitride-based active layer 440, the p-nitride-based cladding layer 450, and the p-ohmic contact layer 460 have substantially a same width. This width of the multiple quantum well nitride-based active layer 440, the p-nitride-based cladding layer 450, and the p-ohmic contact layer 460 is smaller than a width of the substrate 410, nitride-based buffer layer 420 and an n-nitride-based cladding layer 430.

In an exemplary embodiment, the substrate 410 comprises a sapphire substrate. The substrate 410, the nitride-based buffer layer 420, the n-nitride-based cladding layer 430, the multiple quantum well nitride-based active layer 440, and the p-nitride-based cladding layer 450 form a light emitting structure. In addition, the p-ohmic contact layer 460 including the ohmic modification layer 460a and the transparent conducting layer 460b sequentially deposited on the p-nitride-based cladding layer 450, serves as a p-ohmic electrode structure.

In exemplary embodiments, the substrate 410 includes an insulating material, such as sapphire ($Al_2O_3$).

In alternative exemplary embodiments, the nitride-based buffer layer 420 can be omitted.

In an exemplary embodiment, each of the nitride-based buffer layer 420, the n-nitride-based cladding layer 430, the multiple quantum well nitride-based active layer 440, and the p-nitride-based cladding layer 450 includes a compound selected from III-nitride-based compounds expressed as $Al_xIn_yGa_zN$ (x, y and z are integers). In addition, dopant can be added to the n-nitride-based cladding layer 430 and the p-nitride-based cladding layer 450.

In exemplary embodiments, the multiple quantum well nitride-based active layer 440 can be prepared in the form of a single layer or a multiple quantum well ("MQW") layer.

In an exemplary embodiment, if a GaN-based compound is used to fabricate the nitride-based light emitting device, the nitride-based buffer layer 420 can be formed using GaN, the n-nitride-based cladding layer 430 can be formed by adding n-dopant, such as silicon (Si), germanium (Ge), selenium (Se), or tellurium (Te), to GaN, the nitride-based active layer 440 can be prepared in the form of InGaN/GaN MQW or AlGaN/GaN MQW, and the p-nitride-based cladding layer 450 can be formed by adding p-dopant, such as magnesium (Mg), zinc (Zn), calcium (Ca), strontium (Sr), barium (Ba) or beryllium (Be), to GaN.

In an exemplary embodiment, an n-ohmic contact layer (not shown) can be interposed between the n-nitride-based cladding layer 430 and the n-type electrode pad 480. The n-ohmic contact layer may have various structures generally known in the art, such as an aluminum/titanium (Al/Ti) layer.

In an exemplary embodiment, the p-type electrode pad 470 can have a stacked layer structure, such as a nickel/gold (Ni/Au) layer or a silver/gold (Ag/Au) layer.

The above layers of the p-type electrode pad 470 can be formed by a deposition method, such as for example E-beam or thermal evaporation, PVD (physical vapor deposition) using laser or pulsed laser deposition, MOCVD (metal organic chemical vapor deposition), PLD (plasma laser deposition), dual-type thermal evaporation, or sputtering.

The multiple p-ohmic contact layer 460 is considered the p-ohmic electrode structure including the ohmic modification layer 460a and the current spread layer 460b formed on the p-nitride-based cladding layer 450.

In an exemplary embodiment, when the ohmic modification layer 460a is subjected to an annealing process at the temperature of 500° C. or above, the ohmic modification layer 460a attains greater transparency and improved p-ohmic contact. The ohmic modification layer 460a undergoes at least partial decomposition during annealing, and the decomposition products are believed to diffuse into and/or combine with components of the current spread layer 460b, thereby forming transparent conducting particles and/or a new transparent conducting phase. In this way, the ohmic modification layer 460a can readily combine with components of the current spread layer 460b formed on the ohmic modification layer 460a, to form the p-ohmic contact.

In one exemplary embodiment, the ohmic modification layer is a III-nitride-based poly-crystal layer or a III-nitride-based amorphous layer, which is formed at a temperature of 700° C. or below. In addition, the ohmic modification layer can be prepared in the form of a droplet, a nano-dot or a thin film including at least one of aluminum (Al), indium (In) or gallium (Ga) without using nitrogen (N). In this case, when performing the annealing process at the temperature of 500° C. or above in order to form the multiple p-ohmic contact layer, a chemical reaction is promoted at the interfacial surface between the ohmic modification layer and the transparent conducting layer formed on the ohmic modification layer so that the ohmic contact characteristics can be improved, thereby forming a new transparent conducting layer suitable for a high-quality p-ohmic contact layer.

In exemplary embodiments, the multiple p-ohmic contact layer 460 may be formed through any of a number of deposition methods, such as E-beam or thermal evaporation, PVD (physical vapor deposition or pulsed laser deposition) using laser, MOCVD (metal organic chemical vapor deposition), PLD (plasma laser deposition), dual-type thermal evaporation, or sputtering.

In an exemplary embodiment, the multiple p-ohmic contact layer 460 can be deposited in an evaporator having the pressure between atmospheric pressure and 10-12 torr within the temperature range between 20° C. to 1500° C.

In exemplary embodiments, the annealing process is performed after the multiple p-ohmic contact layer 460 has been formed.

In one exemplary embodiment, the annealing process is performed for 3 seconds to 3 hours within the temperature range between 100° C. and 800° C. under a vacuum atmosphere or various gas atmospheres.

In one exemplary embodiment, at least one of nitrogen ($N_2$), argon (Ar), helium (He), oxygen ($O_2$), hydrogen ($H_2$), or air may be fed into a reactor during the annealing process.

Figure 5:
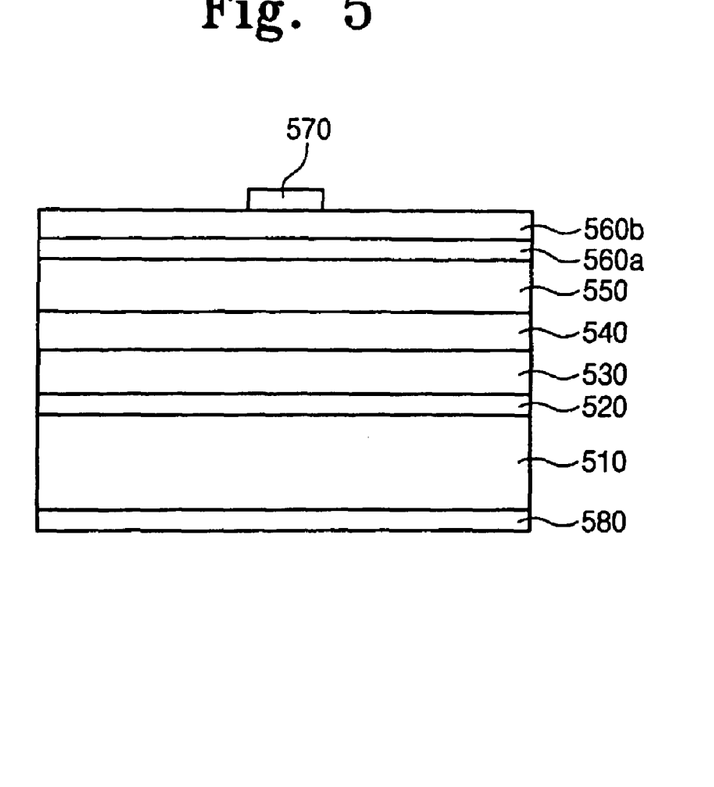
FIG. 5 is a cross-sectional view showing another exemplary embodiment of a top emission type light emitting device including a multiple p-ohmic contact layer according to the present invention.

FIG. 5 is a cross-sectional view showing a top emission type light emitting device according to the present invention, which is substantially identical to the top emission type light emitting device of FIG. 4, except for a substrate 510.

The substrate 510 of the top emission type light emitting device of FIG. 5 includes conductive materials, such as silicon (Si), SiC, GaAs, ZnO, or MgZnO, instead of the insulating material, such as sapphire.

The nitride-based top emission type light emitting device of FIG. 5 includes a nitride-based buffer layer 520, an n-nitride-based cladding layer 530, a multiple quantum well nitride-based active layer 540, a p-nitride-based cladding layer 550, and a p-ohmic contact layer 560 sequentially formed on the substrate 510. Reference numerals 570 and 580 represent a p-type electrode pad and an n-type electrode pad, respectively. The multiple p-ohmic contact layer 560 includes an ohmic modification layer 560a and a transparent conducting layer 560b.

In the illustrated embodiment, the n-type electrode pad 580 is disposed on a lower surface of the substrate 510, instead of being disposed on a portion of the n-nitride-based cladding layer, such as is illustrated in FIG. 4. The n-type electrode pad 580 is disposed on an entire of the lower surface, but is not limited thereto. The p-type electrode pad 570 is disposed on a portion of the transparent conducting layer 560b other than an end part of the transparent conducting layer 560b. The multiple quantum well nitride-based active layer 540, a p-nitride-based cladding layer 550, and a p-ohmic contact layer 560 are substantially the same width as the substrate 510 and the nitride-based buffer layer 520.

Figure 6:
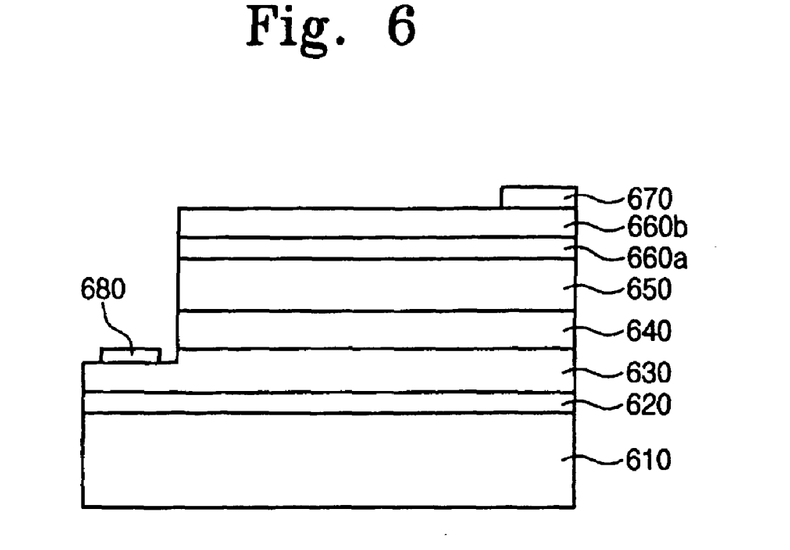
FIG. 6 is a cross-sectional view showing another exemplary embodiment of a top emission type light emitting device including a multiple p-ohmic contact layer according to the present invention.

FIG. 6 is a cross-sectional view showing an exemplary embodiment of a top emission type light emitting device according to the present invention. In the illustrated embodiment, an ohmic modification layer 660a includes poly-crystal nitride or amorphous nitride. The poly-crystal nitride or amorphous nitride can be obtained by combining nitrogen (N) with at least one of aluminum (Al), indium (In) or gallium (Ga) while adding a great amount of Group-II elements, such as magnesium (Mg), zinc (Zn) or beryllium (Be) used as dopant for a p-nitride-based semiconductor, to the ohmic modification layer 660*a* in such a manner that an alloy or a solid solution can be formed.

The nitride-based top emission type light emitting device includes a substrate 610. A nitride-based buffer layer 620, an n-nitride-based cladding layer 630, a multiple quantum well nitride-based active layer 640, a p-nitride-based cladding layer 650, and a p-ohmic contact layer 660 are sequentially formed on the substrate 610. Reference numerals 670 and 680 represent a p-type electrode pad and an n-type electrode pad, respectively.

In the illustrated embodiment, the n-type electrode pad 680 is disposed on an extending portion of the n-nitride-based cladding layer 630. The extending portion of the n-nitride-based cladding layer 630 forms a "step." The multiple quantum well nitride-based active layer 640, the p-nitride-based cladding layer 650, and the p-ohmic contact layer 660 have substantially a same width. This width of the multiple quantum well nitride-based active layer 640, the p-nitride-based cladding layer 650, and the p-ohmic contact layer 660 is smaller than a width of the substrate 610, nitride-based buffer layer 620 and an n-nitride-based cladding layer 430.

Figure 7:
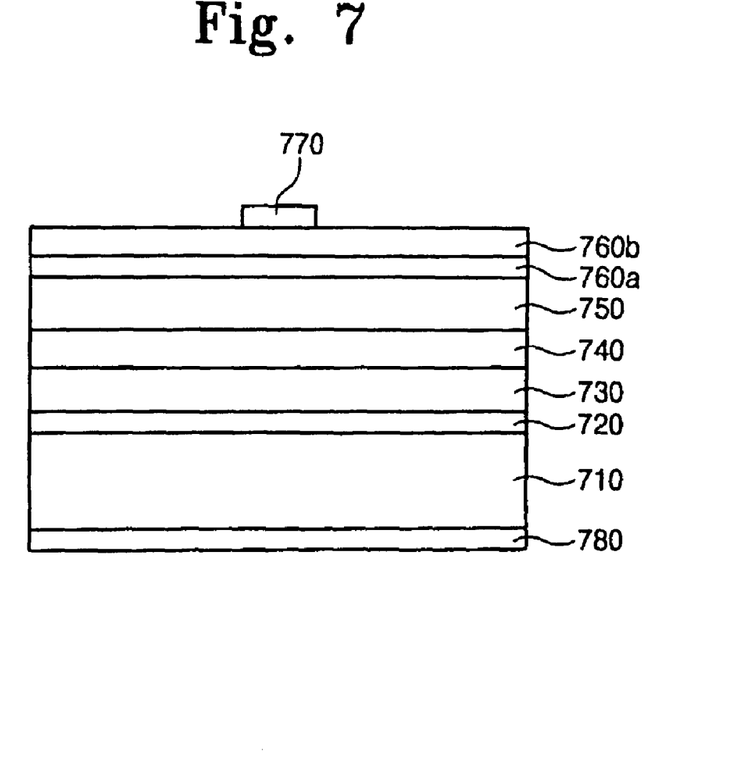
FIG. 7 is a cross-sectional view showing another exemplary embodiment of a top emission type light emitting device including a multiple p-ohmic contact layer according the present invention.

FIG. 7 is a cross-sectional view showing an exemplary embodiment of a top emission type light emitting device according to the present invention, which is substantially the same as the top emission type light emitting device of FIG. 6, except for a substrate 710. The substrate 710 of the top emission type light emitting device of FIG. 7 includes conductive materials, such as silicon (Si), SiC, GaAs, ZnO, or MgZnO, instead of the insulating material, such as sapphire.

The nitride-based top emission type light emitting device of FIG. 7 includes a nitride-based buffer layer 720, an n-nitride-based cladding layer 730, a multiple quantum well nitride-based active layer 740, a p-nitride-based cladding layer 750, and a p-ohmic contact layer 760 sequentially formed on the substrate 710. Reference numerals 770 and 780 represent a p-type electrode pad and an n-type electrode pad, respectively. The multiple p-ohmic contact layer 760 includes an ohmic modification layer 760*a* and a transparent conducting layer 760*b*.

In the illustrated embodiment, the n-type electrode pad 780 is disposed on a lower surface of the substrate 710, instead of being disposed on a portion of the n-nitride-based cladding layer, such as is illustrated in FIG. 6. The n-type electrode pad 780 is disposed on an entire of the lower surface, but is not limited thereto. The p-type electrode pad 770 is disposed on a portion of the transparent conducting layer 760*b* other than proximate to an (outer) edge of the transparent conducting layer 760*b*. The multiple quantum well nitride-based active layer 740, a p-nitride-based cladding layer 750, and a p-ohmic contact layer 760 are substantially the same width as the substrate 710 and the nitride-based buffer layer 720.

Figure 8:
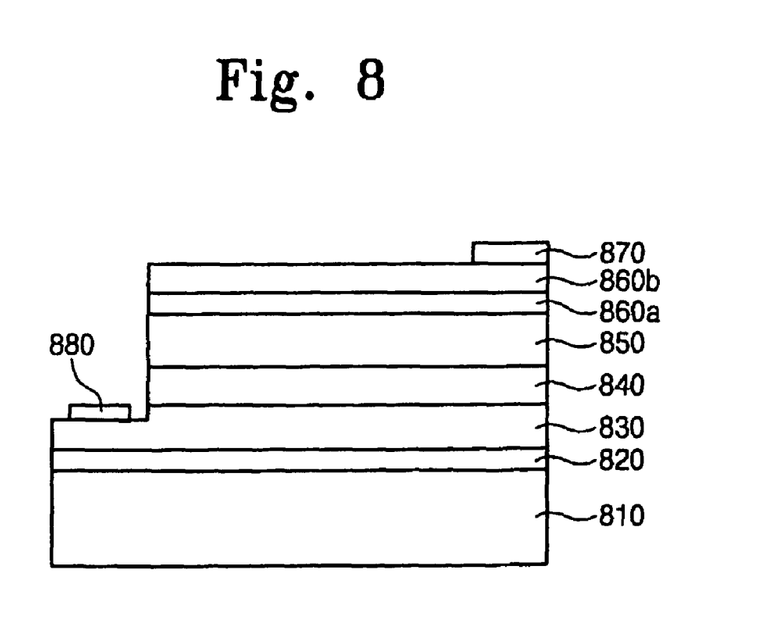
FIG. 8 is a cross-sectional view showing another exemplary embodiment of a top emission type light emitting device including a multiple p-ohmic contact layer according to the present invention.

FIG. 8 is a cross-sectional view showing an exemplary embodiment of a top emission type light emitting device according to the present invention, in which an ohmic modification layer 860*a* is prepared in the form a droplet, a nanodot or a thin film including at least one of aluminum (Al), indium (In) or gallium (Ga) without using nitrogen (N) and Group-II elements, such as magnesium (Mg), zinc (Zn) or beryllium (Be) which is used as dopant for a p-nitride-based semiconductor.

The nitride-based top emission type light emitting device includes a substrate 810. A nitride-based buffer layer 680, an n-nitride-based cladding layer 830, a multiple quantum well nitride-based active layer 840, a p-nitride-based cladding layer 850, and a p-ohmic contact layer 860 are sequentially formed on the substrate 810. Reference numerals 870 and 880 represent a p-type electrode pad and an n-type electrode pad, respectively.

Figure 9:
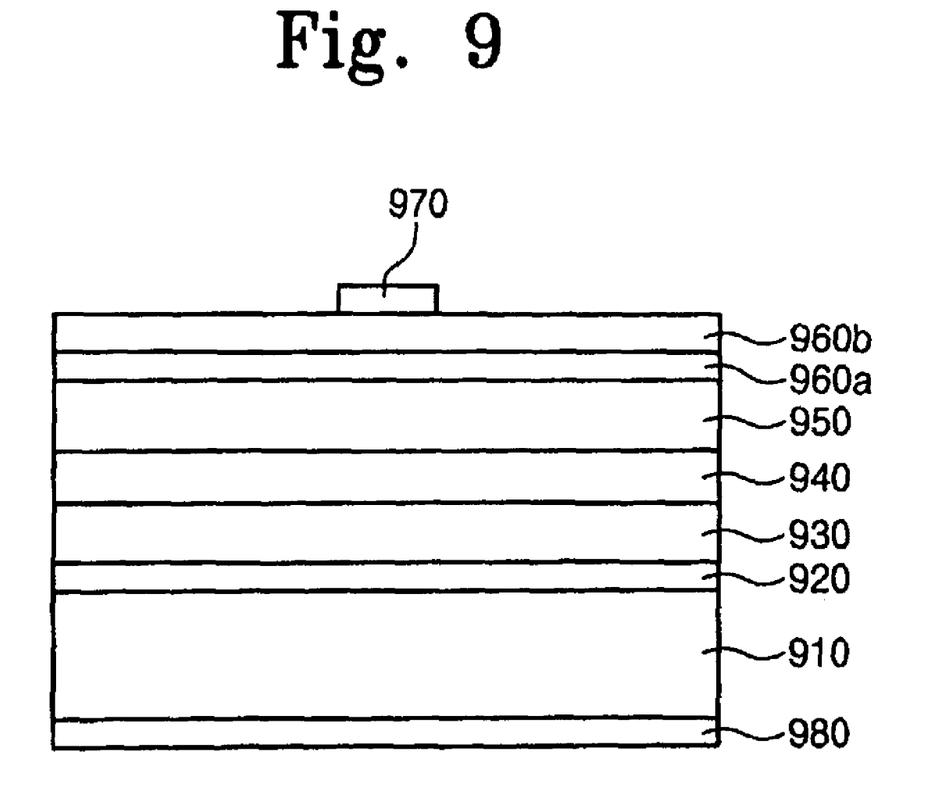
FIG. 9 is a cross-sectional view showing another exemplary embodiment of a top emission type light emitting device including a multiple p-ohmic contact layer according to the present invention.

FIG. 9 is a cross-sectional view showing an exemplary embodiment of a top emission type light emitting device according to the present invention, which is substantially the same to the top emission type light emitting device of FIG. 7, except for a substrate 910.

The nitride-based top emission type light emitting device of FIG. 9 includes a nitride-based buffer layer 920, an n-nitride-based cladding layer 930, a multiple quantum well nitride-based active layer 940, a p-nitride-based cladding layer 950, and a p-ohmic contact layer 960 sequentially formed on the substrate 910. Reference numerals 970 and 980 represent a p-type electrode pad and an n-type electrode pad, respectively. The multiple p-ohmic contact layer 960 includes an ohmic modification layer 960*a* and a transparent conducting layer 960*b*.

In the illustrated embodiment, the n-type electrode pad 980 is disposed on a lower surface of the substrate 910, instead of being disposed on a portion of the n-nitride-based cladding layer, such as is illustrated in FIG. 6. The n-type electrode pad 980 is disposed on the entire lower surface, but is not limited thereto. The p-type electrode pad 970 is disposed on a portion of the transparent conducting layer 960*b* other than proximate to an (outer) edge of the transparent conducting layer 960*b*. The multiple quantum well nitride-based active layer 940, a p-nitride-based cladding layer 950, and a p-ohmic contact layer 960 are substantially the same width as the substrate 910 and the nitride-based buffer layer 920.

The top emission type light emitting device according to the sixth embodiment of the present invention illustrated in FIG. 9 differs from that illustrated in FIG. 7 in that the substrate 910 includes conductive materials, such as silicon (Si), SiC, GaAs, ZOO, or MgZnO, instead of an insulating material, such as sapphire.

In the illustrated embodiment, the multiple p-ohmic contact layer includes a photonic crystal effect by depositing at least one pair of ohmic modification layer-transparent conducting layer on the p-nitride-based cladding layer.

In the illustrated embodiments, the nitride-based top emission type light emitting device employing the multiple p-ohmic contact layer and the manufacturing method thereof, the electric characteristic, e.g., the non-contact ohmic contact characteristic, is improved between the p-nitride-based cladding layer and the multiple p-ohmic contact layer so that the nitride-based top emission type light emitting device can represent improved current-voltage characteristics and higher light transmittance. Advantageously, the nitride-based top emission type light emitting device having the high capacity, large area, and high light transmittance can be obtained.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A nitride-based top emission type light emitting device comprising:
    an n-nitride-based cladding layer;
    a p-nitride-based cladding layer;
    a nitride-based active layer interposed between the n-nitride-based cladding layer and the p-nitride-based cladding layer; and a p-ohmic contact multi-layer disposed on the p-nitride-based cladding layer, wherein the p-ohmic contact multi-layer includes at least one pair of an ohmic modification layer and a transparent current spread layer on the ohmic modification layer, the ohmic modification layer being a poly-crystal nitride layer or an amorphous nitride layer including nitrogen (N) combined with at least one of aluminum (Al), indium (In) and gallium (Ga), and wherein the ohmic modification layer is not a nitride-based epitaxial layer, and wherein the poly-crystal nitride layer or the amorphous nitride layer comprises micro-sized pores or dots aligned to have photonic crystal effect, wherein a new phase is formed at least at an interface between the ohmic modification layer and the current spread layer through chemical reaction therebetween by annealing.

2. The nitride-based top emission type light emitting device of claim 1, wherein the current spread layer includes a transparent conducting oxide layer or a transparent conducting nitride layer, the transparent conducting oxide layer formed by combining oxygen (O) with at least one of indium (In), tin (Sn), zinc (Zn), gallium (Ga), cadmium (Cd), magnesium (Mg), beryllium (Be), silver (Ag), molybdenum (Mo), vanadium (V), copper (Cu), iridium (Ir), rhodium (Rh), ruthenium (Ru), tungsten (W), titanium (Ti), tantalum (Ta), cobalt (Co), nickel (Ni), manganese (Mn), platinum (Pt), palladium (Pd), aluminum (Al), and lanthanum (La), and the transparent conducting nitride layer including transitional metal nitride formed by combining nitrogen (N) with titanium (Ti), tungsten (W), tantalum (Ta), vanadium (V), chrome (Cr), zirconium (Zr), niobium (Nb), hafnium (Hf), rhenium (Re) or molybdenum (Mo).

3. The nitride-based top emission type light emitting device of claim 2, wherein the amorphous nitride-based layer or the poly-crystal nitride-based layer is formed by an electrochemical method, a physical method, or a chemical method before the current spread layer is deposited during a process of forming the p-ohmic contact multi-layer.

4. The nitride-based top emission type light emitting device of claim 1, wherein the ohmic modification layer has a thickness in a range between 0.1 nanometer and 100 nanometer and the current spread layer has a thickness in a range between 1 nanometer and 1000 nanometer.

5. The nitride-based top emission type light emitting device of claim 4, wherein the amorphous nitride-based layer or the poly-crystal nitride-based layer is formed by an electrochemical method, a physical method, or a chemical method before the current spread layer is deposited during a process of forming the p-ohmic contact multi-layer.

6. The nitride-based top emission type light emitting device of claim 1, wherein the ohmic modification layer is prepared in a form of a droplet, a nano-dot or a thin film including at least one of aluminum (Al), indium (In) and gallium (Ga).

7. The nitride-based top emission type light emitting device of claim 6, wherein the amorphous nitride-based layer or the poly-crystal nitride-based layer is formed by an electrochemical method, a physical method, or a chemical method before the current spread layer is deposited during a process of forming the p-ohmic contact multi-layer.

8. The nitride-based top emission type light emitting device of claim 1, wherein the amorphous nitride-based layer or the poly-crystal nitride-based layer is formed by an electrochemical method, a physical method or a chemical method before the current spread layer is deposited during a process of forming the p-ohmic contact multi-layer.

* * * * *